(12) United States Patent
Ballarin et al.

(10) Patent No.: US 8,115,534 B2
(45) Date of Patent: Feb. 14, 2012

(54) ANALOG SWITCH CONTROLLER

(75) Inventors: Fabio Ballarin, Villach (AT); Martin Clara, Villach (AT); Thomas Ferianz, Bodensdorf (AT)

(73) Assignee: Infineon Technologies AG, Neubiberg (DE)

( * ) Notice: Subject to any disclaimer, the term of this patent is extended or adjusted under 35 U.S.C. 154(b) by 407 days.

(21) Appl. No.: 12/494,783

(22) Filed: Jun. 30, 2009

(65) Prior Publication Data

US 2010/0033227 A1    Feb. 11, 2010

Related U.S. Application Data

(62) Division of application No. 12/027,074, filed on Feb. 6, 2008, now Pat. No. 7,652,528.

(51) Int. Cl.
    *H03K 17/687* (2006.01)
(52) U.S. Cl. ...................... 327/427; 327/333
(58) Field of Classification Search .................. None
    See application file for complete search history.

(56) References Cited

U.S. PATENT DOCUMENTS

| | | | | |
|---|---|---|---|---|
| 5,751,186 A * | 5/1998 | Nakao | .......... | 327/562 |
| 5,984,448 A * | 11/1999 | Yanagawa | .......... | 347/10 |
| 6,229,732 B1 * | 5/2001 | Lin et al. | .......... | 365/185.18 |
| 6,674,679 B1 * | 1/2004 | Perner et al. | .......... | 365/209 |
| 7,391,201 B2 * | 6/2008 | Ji | .......... | 323/368 |

* cited by examiner

*Primary Examiner* — Cassandra Cox
(74) *Attorney, Agent, or Firm* — SpryIP, LLC

(57) ABSTRACT

Methods and systems for implementing an analog switch controller to improve linearity of analog switches are described.

13 Claims, 5 Drawing Sheets

ANALOG SWITCH CONTROLLER

This Application is a Divisional Application of co-pending application Ser. No. 12/027,074. The priority of the co-pending Application is hereby claimed.

BACKGROUND

Analog and mixed signal circuits typically use analog switches that include transistors such as MOSFETs as switching elements. Analog switches are usually driven by a DC control signal that can switch the MOSFETs either on or off. When the DC control signal is applied to the gate of a MOSFET, the signal reduces the ON resistance ($R_{on}$) of the MOSFET, thereby allowing the MOSFET to send an analog signal from the source to the drain.

Resistance $R_{on}$ of a MOSFET in an analog circuit is a factor in maintaining a high degree of linearity in the circuit. Fluctuations in gate to source voltage ($V_{gs}$) can modulate the resistance $R_{on}$ of the MOSFET, which in turn can distort signals passing through the MOSFET. For example, fluctuations of $R_{on}$ can occur, due to bulk-effect (i.e., modulation of the MOSFET threshold-voltage, due to variations of its source-to-bulk potential), or if the source of the MOSFET is not connected to an AC ground (i.e., the source signal contains AC components) while the gate of the MOSFET is driven by a DC control signal; or when when the gate voltage of the MOSFET fluctuates, and the source is tied to a DC voltage.

FIG. 1 is a prior art differential gain stage 100 with programmable input and feedback resistances. The differential gain stage 100 includes a differential input signal $V_{inD}$ 102 and a common mode input signal $V_{inCM}$ 104. The input signals are added at summing devices or adders 106, and the added signals are fed to the input terminals of an operational amplifier (op-amp) 108. The path of the added signals includes analog switches 110-1 and 110-2 implemented as MOSFETs, and programmable resistors 112-1 and 112-2. The op-amp 108 further includes two negative feedback loops having analog switches 110-3 and 110-4 implemented as MOSFETs, and programmable resistors 112-3 and 112-4. Nodes $V_n$ 114 and $V_p$ 116 represent virtual ground nodes of the op-amp 108 and follow the common mode input signal $V_{inCM}$ 104, with a factor of: $1/(1+(R\ 112\text{-}1/R\ 112\text{-}3))$, since this voltage swing is not suppressed by the op-amp loop-gain, as with the differential signal.

The common mode input voltage $V_{inCM}$ 104 can have a non-zero AC component, or noise, that is reproduced at virtual ground nodes $V_n$ 114 and $V_p$ 116. In addition, as the source terminals of the MOSFET switches 110 are connected to the virtual ground nodes $V_n$ 114 and $V_p$ 116, the AC component at the virtual ground nodes $V_n$ 114 and $V_p$ 116 modulates the resistance $R_{on}$ of the switches. This introduces fluctuations in the MOSFET switches 110, which in turn cause distortions in output signals $V_{outp}$ 118 and $V_{outn}$ 120.

Active devices such as filters can be employed to suppress the AC component of the common mode input signal $V_{inCM}$ 104; however, filters themselves can introduce noise into a circuit. Another method used for reducing the distortion introduced by MOSFET switches is to reduce the resistance $R_{on}$ of the switches by increasing the size of the switches. Such an arrangement can lead to higher area consumption and an increased MOSFET parasitic capacitance. Another way to reduce $R_{on}$ is by increasing the gate to source volatge $V_{gs}$; however, $V_{gs}$ is limited by the supply voltage $V_{dd}$ 122. Therefore, there is typically noise or fluctuations in the common mode input signal which cause distortions in signals passing through the MOSFET switches 110, and can distort the output signals $V_{outp}$ 118 and $V_{outn}$ 120.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION

Figure 1:
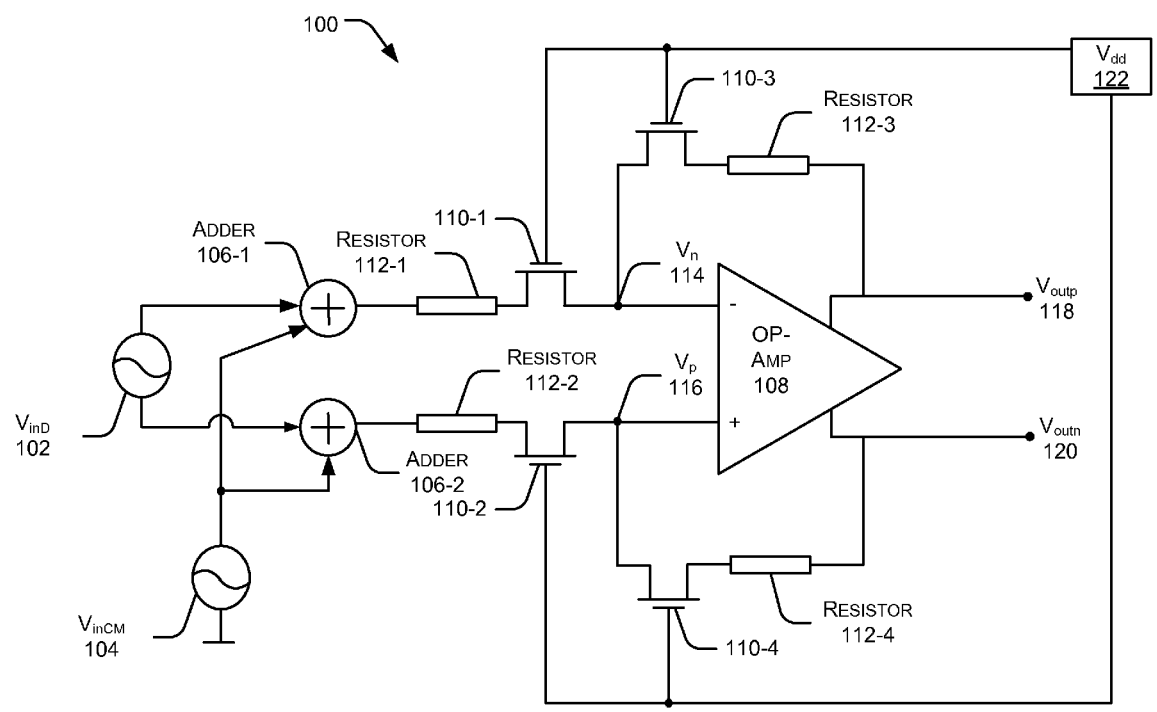
FIG. 1 is a prior art differential gain circuit.

This disclosure is directed towards techniques and methods for controlling analog switches in order to improve linearity of the analog switches. Analog switch controllers can be implemented in a variety of analog and mixed signal circuits that employ analog switches, such as gain control blocks, analog to digital converters, etc. For example, an analog switch controller can be implemented in automatic gain control circuits used in audio communication systems, radar systems, telecommunication systems, and so on.

Analog switches, such as MOSFETs, are usually driven by DC control signals. In an implementation, a DC control signal drives the gate of a MOSFET. The presence of the DC control signal reduces the resistance $R_{on}$ of the MOSFET, thereby turning the MOSFET on. If source terminal of the MOSFET is not AC grounded (i.e., the source signal contains AC components, noise, or electrical disturbances), fluctuations in the source signal can modulate the resistance $R_{on}$ of the MOSFET, thus producing fluctuations in the output. Any change in the resistance $R_{on}$ of the MOSFET can turn off the MOSFET unexpectedly or cause distortions in an analog signal that the MOSFET transfers.

The described analog switch controller can help realize a linear analog switch by avoiding modulation of the ON resistance $R_{on}$ of the MOSFET. Modulation of the ON resistance $R_{on}$ may be due to fluctuations in the gate to source voltage $V_{gs}$, or to bulk-effect. Fluctuations in the gate to source voltage $V_{gs}$ of a MOSFET occur due to various reasons, such as when either the gate or the source of the MOSFET is at a DC potential, while the other terminal is not. The analog switch controller replicates the voltage fluctuations present at either the gate or the source terminal and feeds the replicated signal to the other terminal. In this manner, the fluctuations are removed from the gate to source voltage $V_{gs}$. The bulk-effect consists of the modulation of the threshold-voltage of the MOSFET, due to variations of its source-to-bulk potential. This effect is present in MOSFET not lying in a dedicated well.

In an implementation, the DC control signal can be present at the gate terminal of the MOSFET switch, while its source voltage fluctuates due to AC components in the input signal. In such a case, the analog switch controller replicates the signal at the source and shifts the replicated signal by a pre-determined voltage to generate the gate voltage to turn-on the switch.

To this end, the analog switch controller includes a tracker and a level shifter. The tracker tracks the fluctuating voltage and replicates it. The level shifter then shifts the reference voltage of the replicated signal and feeds the level shifted replicated signal to the non-fluctuating terminal of the MOSFET.

Though the following implementations of an analog switch controller are described with reference to fluctuations arising due to source voltage, it is to be understood that similar techniques can be used to remove fluctuations arising due to gate voltage.

Figure 2:
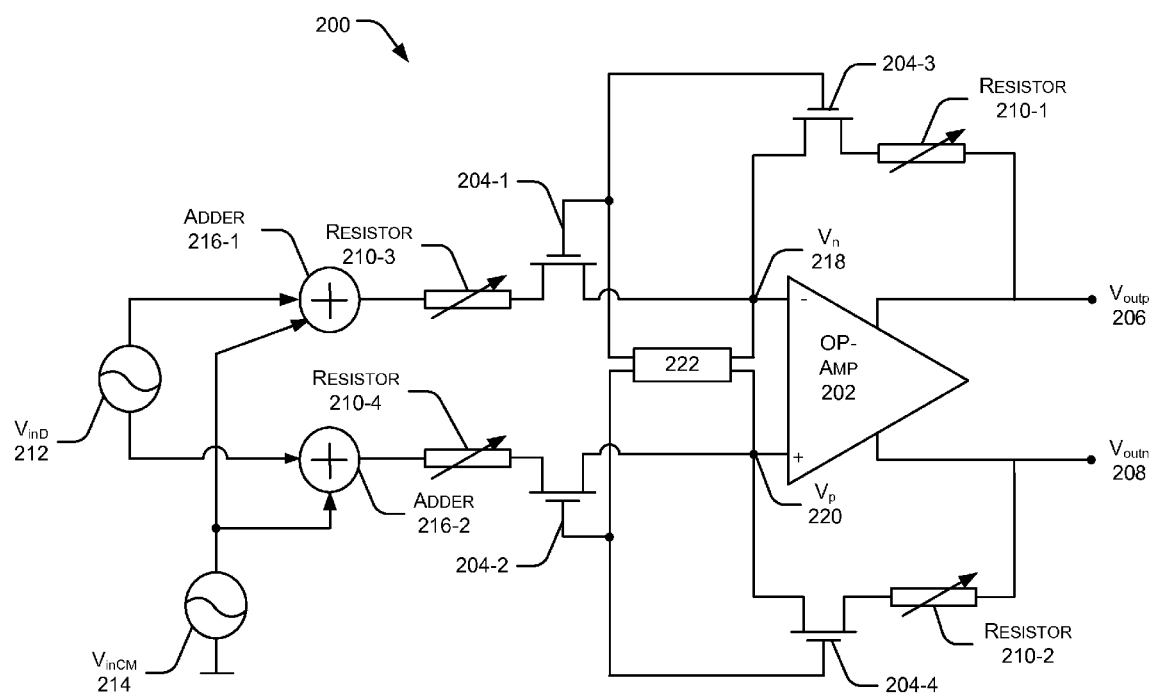
FIG. 2 is an exemplary adaptive gain circuit that uses an analog switch controller.

FIG. 2 illustrates an exemplary automatic gain control unit 200 that incorporates an analog switch controller. It is to be appreciated that the analog switch controller can be implemented in a number of other electronic devices/apparatuses and circuits that employ analog switches and is not limited to the exemplary automatic gain control unit 200. The automatic gain control unit 200 may be implemented as a filter with programmable impedances. In specific, the filter may be a single ended filter.

The automatic gain control unit 200 includes an operational amplifier or op-amp 202. In one implementation, the op-amp 202 may be a differential amplifier. The inverting input terminal of the op-amp 202 is connected to an analog switch 204-1, while the non-inverting input terminal of the op-amp 202 is connected to an analog switch 204-2. The op-amp 202 can have multiple feedback loops. In an implementation, the op-amp 202 can have two negative feedback loops; one feedback loop lies between the inverting input terminal and the positive output terminal 206, while the other feedback loop lies between the non-inverting input terminal and the negative output terminal 208. Each of the feedback loops has a respective programmable impedance, 210-1 and 210-2, and a respective analog switch, 204-3 and 204-4.

Inputs to the automatic gain control unit 200 are received from one or more signal sources. The signal fed to the automatic gain control unit 200 can be an analog signal, such as an audio signal, a video signal, or a combination thereof. In an implementation, the one or more analog sources can be a differential input source $V_{inD}$ 212 and a common mode input source $V_{inCM}$ 214.

The differential input source $V_{inD}$ 212 represents voltage difference between the positive and negative input signals of an analog source (e.g., a microphone, camera, etc.) Accordingly, the differential input signal $V_{inD}$ 212 can be represented as:

$$V_{inD}=(V_{in}+)-(V_{in}-) \quad (1)$$

The common mode input source $V_{inCM}$ 214 represents the average voltage of the positive and negative input signals of the analog source. Accordingly, the common mode input signal $V_{inCM}$ 214 can be represented as:

$$V_{inCM}=((V_{in}+)+(V_{in}-))/2 \quad (2)$$

The two input signals $V_{inD}$ 212 and $V_{inCM}$ 214 can be summed at adders 216. The output signals from the adders 216-1 and 216-2, respectively, pass through programmable impedance 210-3 and 210-4 to the analog switches 204-1 and 204-2. The analog switches 204-1 to 204-4 are collectively referred to as analog switches 204.

Fluctuations in the input signals $V_{inD}$ 212 or $V_{inCM}$ 214 are fed to the switches 204 and can decrease the linearity of the switches 204. For example, fluctuations in an input signal may be caused when electromagnetic interferences are present at the common mode input signal source. Such a disturbance present in the common mode voltage $V_{inCM}$ 214 produces fluctuations at the source of the four analog switches 204, connected at the virtual ground nodes $V_n$ 218 and $V_p$ 220. The $R_{on}$ of the analog switches is modulated by the fluctuations both at its gate-to-source potential, and, for MOSFET not lying in a dedicated well, at its bulk-to-source potential (bulk-effect).

To avoid distortions, an analog switch controller 222 is introduced in the circuit 200. The analog switch controller 222 can track the fluctuations present at the source terminal of the analog switches 204, and can replicate these fluctuations at the gate terminals of the analog switches 204 with a voltage shift. This removes fluctuations from the gate to source voltage $V_{gs}$ and maintains linear operation of the analog switches 204.

Figure 3:
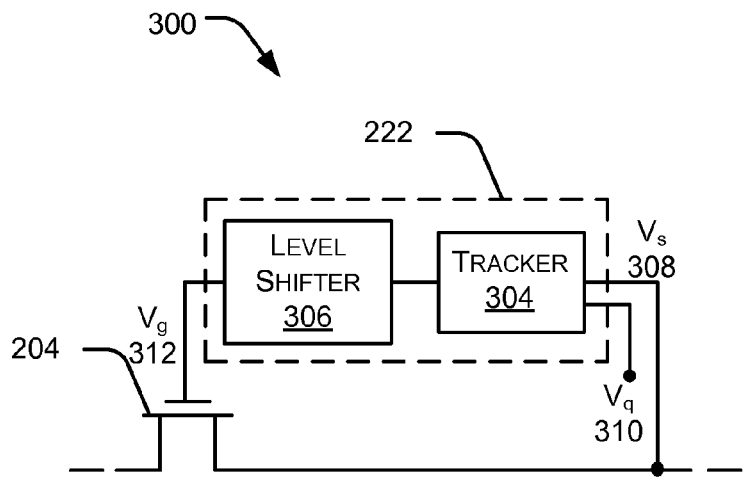
FIG. 3 is a block diagram illustrating an exemplary analog switch controller and a timing diagram of the analog switch controller.
Figure 3:
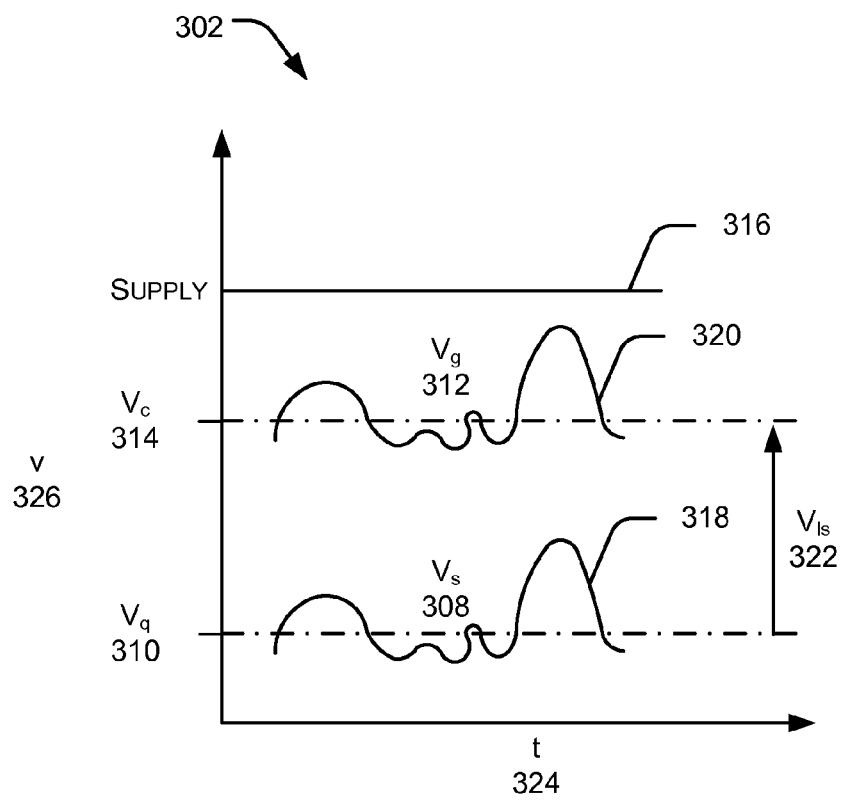

FIG. 3 illustrates a block diagram 300 of the exemplary analog switch controller 222 and a timing diagram 302 of the voltages associated with the analog switch controller 222. The analog switch controller 222 includes a tracker 304 and a level shifter 306.

The tracker 304 tracks fluctuations of the source voltage $V_s$ 308. The fluctuations of the source voltage $V_s$ 308 can be represented as $$\text{Fluctuations}=V_s-V_q \quad (3)$$

Where, $V_q$ 310 is the quiescent DC voltage of the source voltage $V_s$ 308. There can be two inputs to the tracker 304: the source voltage $V_s$ 308 and the quiescent DC voltage $V_q$ 310. The difference of the two input voltages $V_s$ 308 and $V_q$ 310 represents fluctuations in the source voltage $V_s$ 308. The tracker 304 then replicates the resulting fluctuation signal, and forwards the replicated fluctuation signal to the level shifter 306.

The level shifter 306 receives the replicated fluctuation signal from the tracker 304 and adds a DC reference voltage $V_c$ 314 (see timing diagram 302) to the replicated fluctuation signal to generate a shifted signal. The shifted signal is then fed to the gate terminals of the analog switches 204. The shifted signal represents the gate voltage $V_g$ 312 and has fluctuations similar to the source voltage $V_s$ 308 shifted to the DC reference voltage $V_c$ 314.

The timing diagram 302 depicts the source voltage $V_s$ 308 and the generated gate voltage $V_g$ 312, along with the supply voltage 316. The x-axis of the timing diagram represents time (t) 324 while the y-axis represents voltage (v) 326. The source reference signal (i.e., the DC quiescent signal $V_q$ 310), is also depicted in the timing diagram 302. As seen from the timing diagram 302, fluctuations 318 are present in the source signal $V_s$ 308, determined as the difference between the quiescent voltage 310 and source voltage 308.

Fluctuations 318 present in the source signal $V_s$ 308 are tracked, replicated, and then shifted to obtain the gate voltage signal $V_g$ 312. Therefore, the fluctuations 318 present in the source signal $V_s$ 308 can be replicated in the gate signal $V_g$ 312 as fluctuations 320. Furthermore, the DC reference signal $V_c$ 314 added to the replicated fluctuations 320, increases the overall voltage of the gate signal $V_g$ 312.

The magnitude of the DC reference signal $V_c$ 314 can be controlled by regulating a predetermined level shifting signal $V_{ls}$ 322. In an implementation, the level-shifting signal $V_{ls}$ 322 can have a fixed value while in another implementation, the level shifting signal $V_{ls}$ 322 can be programmable, thereby producing varying DC reference voltages $V_c$ 314.

Figure 4:
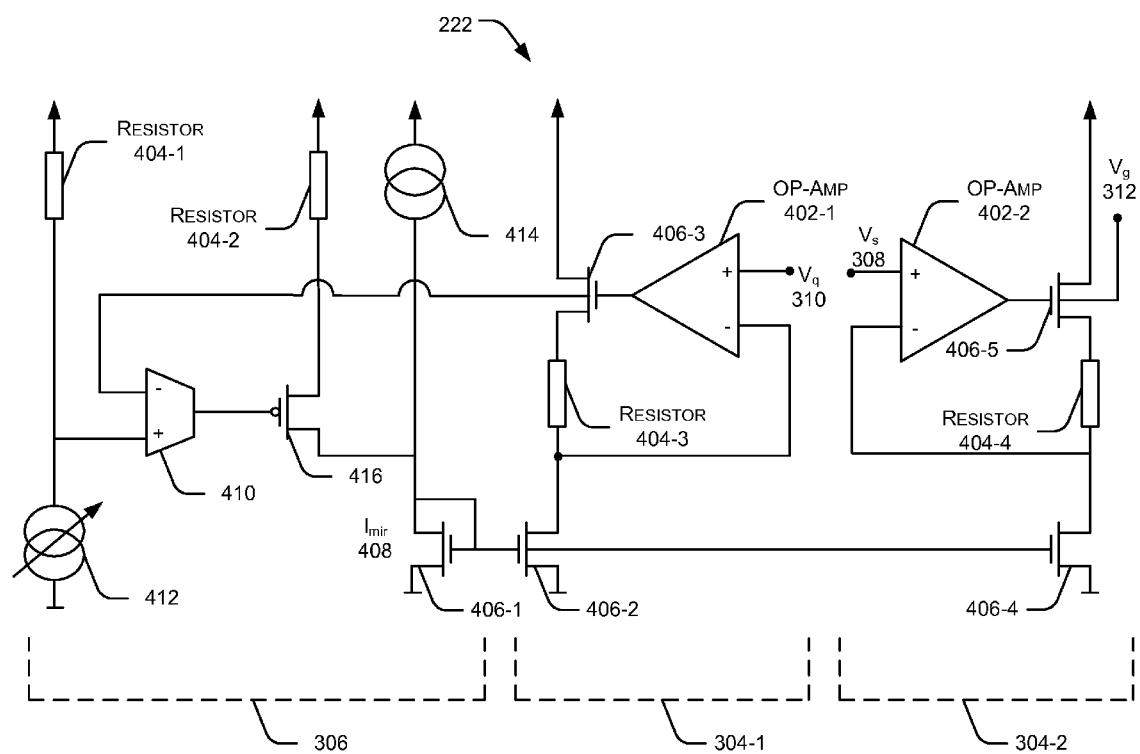
FIG. 4 is an exemplary circuit of an analog switch controller.

FIG. 4 illustrates an exemplary circuit diagram of the analog switch controller 222. In this example, the analog switch controller 222 includes a tracking replica 304-1, a source voltage tracker 304-2, collectively referred to as tracker 304, and a level shifter 306. The tracker 304 includes a plurality of operational amplifiers (op-amps) 402, resistors 404, and MOSFETs 406. The positive input signals to the two op-amps 402 can respectively be the source voltage $V_s$ 308 and the DC quiescent voltage $V_q$ 310. The negative inputs of the operational amplifiers 402 are fed by signals generated from the current signal produced by the level shifter 306, using the resistors 404 and the MOSFETs 406.

The MOSFETs 406-3 and 406-5 are replicas of the controlled analog switches 204 with a width scaled down proportionally with the drain current flowing in them. When MOSFETs 204 do not lie in a dedicated well, they are affected by bulk-effect (i.e., modulation of the MOSFET threshold-voltage, due to variations of its source-to-bulk potential). MOSFETs 406-3 and 406-5 are also affected by bulk-effect. The drain current flowing through the MOSFETs 406-3 and 406-5 is the mirror current $I_{mir}$ 408, mirrored from the current signal produced by the level shifter 306. Thus, the control signal $V_g$ 312, fed to the gate of the MOSFETs 204, compensates also for bulk-effect.

The level shifter 306 includes an operational transconductance amplifier or OTA 410. The inputs to the OTA 410 can be a voltage signal obtained from a current generator 412 and another voltage signal received from the tracker 304. In addition, the level shifter 306 includes a current mirror circuit that has a current source 414, resistors 404-1 and 404-2, and a pMOSFET 416, which generate the current signal mirrored as $I_{mir}$ 408.

The input signals $V_s$ 308 and $V_q$ 310 are respectively fed to the op-amps 402-1 and 402-2. The op-amps 402 produce output voltage signals corresponding to the respective input voltages. The output voltage from the op-amp 402-1 of the tracking replica 304-1 is fed to the OTA 410 included in the level shifter 306. The OTA 410 also receives an input voltage signal corresponding to the reference voltage $V_c$ 314 set by a current source 412 and resistor 404-1. The OTA 410 and the pMOSFET 416 produce an output current signal that adjusts the mirror current $I_{mir}$ 408 in the MOSFET 406-1, which is then mirrored by MOSFET 406-2 and MOSFET 406-4. Thereby the DC value of the voltages at the outputs of op-amps 402-1 and 402-2, minus the DC quiescent voltage $V_q$ 310, corresponds to the level shifting voltage $V_{ls}$ 322.

The output current signal of the OTA 410 and the pMOSFET 416 is transferred to the tracking replica 304-1 and the source voltage tracker 304-2 using the current mirror circuit, where the mirrored current is used to set the drain current of the MOSFETs 406. The source voltage tracker 304-2 then combines the level shifting voltage $V_{ls}$ 322 with the source voltage $V_s$ 308 using the op-amp 402-2. Therefore, the voltage signal $V_g$ 312, obtained at the gate of the op-amp 402-2, is a combination of the source signal fluctuations and the DC reference signal $V_c$ 314.

Exemplary Methods

Figure 5:
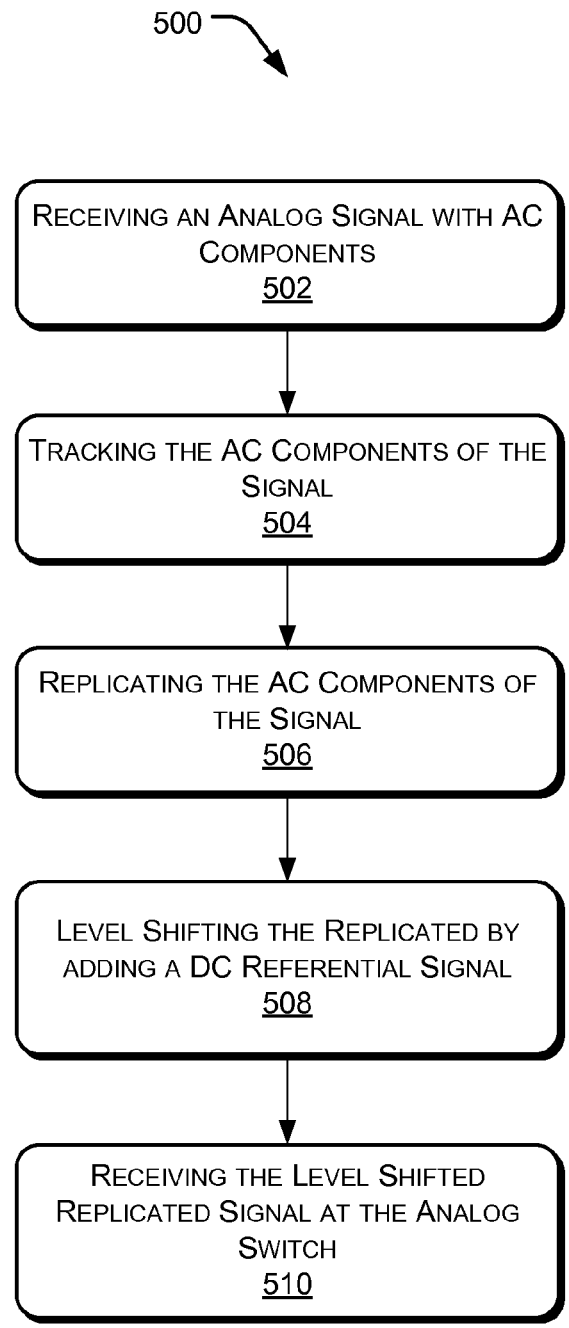
FIG. 5 is a flowchart illustrating an exemplary method for implementing an analog switch controller.

FIG. 5 illustrates an exemplary method for implementing a controller for analog switches and is described with reference to FIGS. 2-4. The order in which the method is described is not intended to be construed as a limitation, and any number of the described blocks can be combined in any order to implement the method, or an alternate method. Individual blocks may be deleted from the method without departing from the spirit and scope of the subject matter described herein.

At block 502, an analog signal with fluctuations is received by an analog switch controller. For example, an analog signal $V_s$ 308 with fluctuations 318 can be received from the source of the analog switch 204-1. The source voltage $V_s$ 308 with fluctuations 318 can be sent to the analog switch controller 222. The fluctuations 318 present in the analog signal can be noise, electrical interference, AC coupled signals (e.g. AC components), and so on.

At block 504, the fluctuations present in the source voltage $V_s$ 308 can be tracked. In an implementation, the tracker 304 included in the analog switch controller 222 can track the signal fluctuations. The DC quiescent voltage $V_q$ 310 can also be fed to the tracker 304 of the analog switch controller 222. The difference between the source voltage $V_s$ 308 and the DC quiescent voltage $V_q$ 310 can represent fluctuations present in the source voltage $V_s$ 308.

In an implementation, the tracker 304 includes operational amplifiers that receive the source voltage $V_s$ 308 and the quiescent voltage $V_q$ 310. The tracker can also include electronic components, such as resistors that can convert the voltage signal into current signals.

At block 506, the AC components of the tracked signal are replicated. For example, the fluctuations 318 of the source signal $V_s$ 308 that have been tracked can be replicated.

At block 508, the replicated signal of block 506 is level shifted to a pre-determined DC reference signal to obtain the output signal $V_g$ 312. For example, the replicated fluctuating signal of the source signal $V_s$ 308 can be level shifted to obtain a signal identical to the fluctuating signal but is shifted to another reference voltage. The level shifter of the analog switch controller 222 can include the operational transconductance amplifier or OTA 410, current generators 412 and 414, pMOSFET 416, and one or more resistors 404.

In an implementation, the current generator 412 can be a variable current generator, which allows the level shifter to shift the replicated signal to a variable DC reference signal.

At block 510, the level shifted signal can be received by the analog switch 204. In an implementation, the level shifted signal can be sent to the gate of the analog switch 204. Since the signal received by the gate, is a level shifted replica of the analog signal at the source of the analog switch, the fluctuations in the gate to source voltage $V_{gs}$ can be removed. Because the gate to source voltage $V_{gs}$ is maintained at a constant value, the ON resistance of the analog switch can be maintained at a constant value and distortion of the analog signal can be avoided.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims. For example, the systems described could be configured as wireless communication devices, computing devices, and other electronic devices.

What is claimed is:

1. An analog switch controller comprising:
a tracker that tracks fluctuations of source voltage from an analog switch, and replicates a fluctuation signal of the source voltage; and
a level shifter that receives a replicated fluctuation signal from the tracker and generates a shifted signal which is fed back to the analog switch.

2. The analog switch controller of claim 1, wherein the tracker includes a tracking replica and source voltage tracker.

3. The analog switch controller of claim 1, wherein the tracker tracks fluctuations of gate voltage of the analog switch.

4. The analog switch controller of claim 1, wherein the tracker tracks fluctuations based on a difference between the source voltage and a quiescent DC voltage of the source voltage.

5. The analog switch controller of claim 1, wherein the level shifter adds a DC reference voltage to the replicated fluctuation signal.

6. The analog switch controller of claim 5, wherein the DC reference voltage is controlled by regulating a predetermined level shifting signal.

7. The analog switch controller of claim 5, wherein the DC reference voltage adds to gate voltage of the analog switch.

8. A method of controlling an analog switch comprising:
receiving a analog signal with fluctuations;
tracking the fluctuations of the analog signal;
replicating the fluctuations of the analog signal;
level shifting replicated fluctuations of the analog signal; and
sending a level shifted replicated signal to the analog switch.

9. The method of claim 8, wherein the receiving includes fluctuations that comprise one or more of noise, electrical interface, and AC coupled signals.

10. The method of claim 8, wherein the tracking the fluctuations is of a difference between a voltage source and quiescent voltage of the analog switch.

11. The method of claim 8, wherein the replicating the fluctuations is of a difference between a voltage source and quiescent voltage of the analog switch.

12. The method of claim 8, wherein the level shifting is shifted to a reference voltage different that the voltage of the fluctuations of the analog signal.

13. The method of claim 8, wherein the sending is to a gate of the analog switch.

* * * * *